United States Patent [19]

Ha

[11] Patent Number: 5,023,681
[45] Date of Patent: Jun. 11, 1991

[54] METHOD FOR ARRANGING EEPROM CELLS AND A SEMICONDUCTOR DEVICE MANUFACTURED BY THE METHOD

[75] Inventor: Chang W. Ha, Pusan, Rep. of Korea

[73] Assignee: Hyundai Electronics Industries Co., Ltd., Rep. of Korea

[21] Appl. No.: 417,286

[22] Filed: Oct. 5, 1989

[30] Foreign Application Priority Data

Oct. 8, 1988 [KR] Rep. of Korea ............... 88-131157

[51] Int. Cl.$^5$ .................. H01L 29/68; H01L 27/10; H01L 29/34; H01L 23/48
[52] U.S. Cl. .................................. 357/23.5; 357/45; 357/54; 357/71
[58] Field of Search ................ 357/23.5, 45, 54, 71; 365/185

[56] References Cited

U.S. PATENT DOCUMENTS

| | | | |
|---|---|---|---|
| 4,686,558 | 8/1987 | Adam | 357/23.5 |
| 4,707,457 | 11/1987 | Erb | 357/23.6 |

FOREIGN PATENT DOCUMENTS

| | | | |
|---|---|---|---|
| 54-137983 | 10/1979 | Japan | 357/23.5 |
| 60-182162 | 9/1985 | Japan | 357/23.5 |

*Primary Examiner*—J. Carroll
*Attorney, Agent, or Firm*—Merchant, Gould, Smith, Edell, Welter & Schmidt

[57] ABSTRACT

A method for arranging EEPROM cells and a semiconductor device manufactured by the method is disclosed. The semiconductor device with an EEPROM cell arrangement comprises a plurality of segmentized buried diffusion regions formed on a semiconductor substrate with each segmentized buried diffusion region with a diffusion region formed in the semiconductor substrate between a selecting transistor and a buried diffusion region and with a diffusion region formed in the semiconductor substrate between adjacent segmentized buried diffusion regions with a contact formed on each diffusion region to connect the diffusion region to a first conducting layer for resistance reduction. The selecting transistor connects the segmentized buried diffusion regions to a bit line through a first conduction layer for via contact and a second conducting layer for bit line by selecting a predetermined number of segmentized buried diffusion regions. Preferably, the method for arranging EEPROM cells includes a column of erased cells between the predetermined number of bit lines, thereby protecting an overcurrent from flowing in the word line direction when a bit line is selected.

3 Claims, 6 Drawing Sheets

METHOD FOR ARRANGING EEPROM CELLS AND A SEMICONDUCTOR DEVICE MANUFACTURED BY THE METHOD

BACKGROUND OF THE INVENTION

1. Field of Invention

This invention relates to a method for arranging EEPROM (Electrically Erasable Programmable Read Only Memory) cells and a semiconductor device manufactured by the method, and more particularly to a method for arranging EEPROM cells such that if a bit line is selected, a bit line adjacent to the bit line becomes a ground line without forming an additional ground line during the cell arrangement and it is connected to the bit line by selecting the predetermined buried diffusion region by a selecting transistor in order to connect the selected bit line to a buried diffusion region separated into a plurality of segments.

2. Information Disclosure Statement

In the prior art, the EEPROM cell arrangement structure requires a ground line and two bit lines for two cells in the bit line direction and, the contact region is needed at the bit line. This arrangement structure presents a problem in that the area of cell is increased in the EEPROM cell arrangement due to the contact for the bit line, and the distance between the contact and the poly layer for gate electrode. Accordingly, in order to solve the problem with the prior art arrangement structure, an attempt had been made to decrease the number of the contacts by forming the buried diffusion region in the substrate in the EPROM cell arrangement.

However, greater parasitic capacitance is produced between the substrate and the diffusion region due to successive formation of the buried diffusion regions under the predetermined cell which is connected to a bit line, thereby resulting in the increase of the time for precharging and discharging the buried diffusion region coupled to the bit line.

SUMMARY OF THE INVENTION

Accordingly, it is an object of the present invention to solve the problems presented in the prior art EEPROM cell arrangement in which a drain contact and a ground line are required for two cells in the bit line direction, thereby increasing the area of the cell and the parasitic capacitance is produced between the buried diffusion region and the substrate when the buried diffusion region is formed for reducing the contact area of the prior art cell, and to provide an improved method for arranging EEPROM cell and a semiconductor device fabricated by the method.

The present invention relates to a semiconductor device formed with EEPROM cell arrangement comprising:

a plurality of segmentized buried diffusion which are formed on a semiconductor substrate, with each being spaced in the bit line direction and which are also formed with each being sequentially spaced in the word line direction, on which respective buried oxide films layer are formed;

floating gate and gate electrode comprising a plurality of the first gate oxide film layers formed on the substrate between a plurality of said buried diffusion regions in the word line direction, a plurality of first poly layers for floating gate, second gate oxide film layers and a second poly layer for gate electrode, which are sequentially formed on a portion of said first gate oxide film layer and a plurality of said buried diffusion regions, respectively;

a plurality of diffusion regions, with each diffusion region having a contact collectively referred to as a plurality of contact-diffusion regions, which are formed on the substrate between said respective buried diffusion regions so as to connect a plurality of buried diffusion regions formed in the bit line direction;

a selecting transistor formed such that it is connected to the first buried diffusion region of a plurality of said segmentized buried diffusion regions said selecting transistor comprising a diffusion region for a source electrode, a diffusion region for drain electrode for sharing with a contact and a second poly for gate electrode;

a plurality of field oxide film layers for insulation formed respectively on the substrate between a plurality of said second poly layers for gate electrode in the bit line direction, and on the substrate between a plurality of said buried diffusion regions in the word line direction and a plurality of said diffusion regions;

a field oxide film layer for segment separation which is formed at the last buried diffusion region of a plurality said segmentized buried diffusion regions formed in the bit line direction and is extended in the word line direction;

a first insulating layer formed on the entire surface except for the plurality of said contact;

a plurality of first conducting layers for via contact connected to said contact formed on said respective diffusion region, with each having a contact for bit line;

a plurality of first conducting layers for resistance reduction formed on said first insulating layer such that they are connected to said contacts formed on each diffusion region of the plurality of contact diffusion regions, respectively;

a second insulating layer formed on the plurality of said first conducting layer for via conduct, on the first conducting layer for plurality of said contacts for bit line;

a plurality of second conducting layer for bit line formed such that each connected to said contact for bit line on said first conducting layer for via conduct; and a protective layer formed on said second conducting layer for bit line and said second insulating layer. thereby selectively connecting the plurality of said segmentized buried diffusion regions to the bit line selected by said selecting transistor, so that a parasitic capacitance produced between the substrate and said buried diffusion regions can be reduced.

The present invention further includes a method for arranging EEPROM cells comprising:

forming a plurality of segmentized buried regions which are formed with each being spaced in the bit line direction and which are also formed with each being sequentially spaced in the word line direction;

forming a plurality of floating gates and gate electrodes a plurality of said segmentized buried diffusion regions such that said floating gates and gate electrodes passes in the word line direction;

forming a plurality of contact diffusion regions on the substrate so as to connect the plurality of buried diffusion regions to each other in the bit line direction;

providing a selecting transistor, having a contact, connected to the first buried diffusion region of a plurality said segmentized buried diffusion regions; providing a field oxide film layer for segment separation formed at the last segmentized buried diffusion region; and arranging the structure, formed on the plurality of segmentized buried diffusion regions from the contact for said selecting transistor to said field oxide film for segment separation, to be symmetric about X axis and arranging repeatedly said structure in the bit line direction, thereby electrically connecting the bit line to a selected buried diffusion regions by one of selecting transistor on the symmetric axis of said symmetrically arranged structures, so that a parasitic capacitance produced between said buried diffusion region and substrate can be reduced.

Preferably, the respective structures formed on a plurality of segmentized buried diffusion regions connected electrically to said selecting transistor, according to the present inventive semiconductor device, are arranged symmetrically about X axis, and such symmetric structure are arranged repeatedly in the bit line direction.

Preferably, the method for arranging EEPROM cells further includes comprising a column of erased cells between the predetermined number of said bit lines, thereby protecting an overcurrent from flowing in the word line direction when a bit line is selected.

According to a feature of present invention, a long buried diffusion region is formed to reduce the number of the contact and the increase of resistance resulting from the prior art structure is avoided by forming a contact with a conductive layer for each of the predetermined number of the buried diffusion regions. Also, an embodiment of present invention comprises such structure that an adjacent bit line of cell can be used as ground line instead of forming a additional ground line, for example, in case of a group comprising 8 bit lines, if the third bit line is selected, the forth bit line can function as a ground line.

According to a further feature of present invention, in order to reduce the parasitic capacitance between the buried diffusion region and the substrate, which is a drawback in the prior art as set forth above, the buried diffusion regions are not arranged successively, but separated into segments of the buried diffusion region having a plurality of cells. The predetermined number of the segmentized buried diffusion region is only selected by the selecting transistor, and is connected to the bit line. The para 'ric capacitance between the substrate and the buried diffusion regions can be minimized in such a way that unselected buried diffusion regions is not connected to the bit line.

BRIEF DESCRIPTION OF THE DRAWINGS

For fuller understanding of the nature and objects of the invention, reference should be made to the following detailed description taken in conjunction with the accompanying drawing in which.

The novel feature of the present invention may be understood from the accompanying description when taken in conjunction with the accompanying drawings.

DETAILED DESCRIPTION

Figure 1:
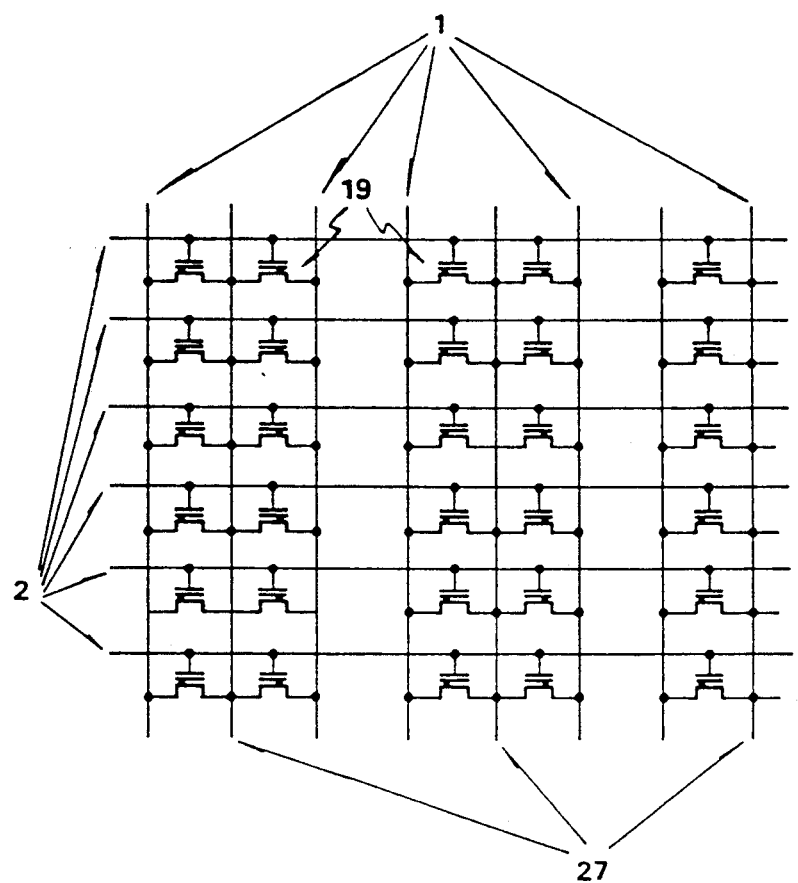
FIG. 1 illustrates an equivalent circuit for the prior art EEPROM cell arrangement structure.

FIG. 1 illustrates an equivalent circuit for the prior art cell arrangement structure using the EEPROM cell 19.

In this structure, two bit line 1 for two EEPROM cells in longitudinal direction, and a ground line 27 between two bit lines 1 are required, resulting in the increase of the area of cell. Herein, the lines in transversal direction indicates word lines 2.

Figure 2:
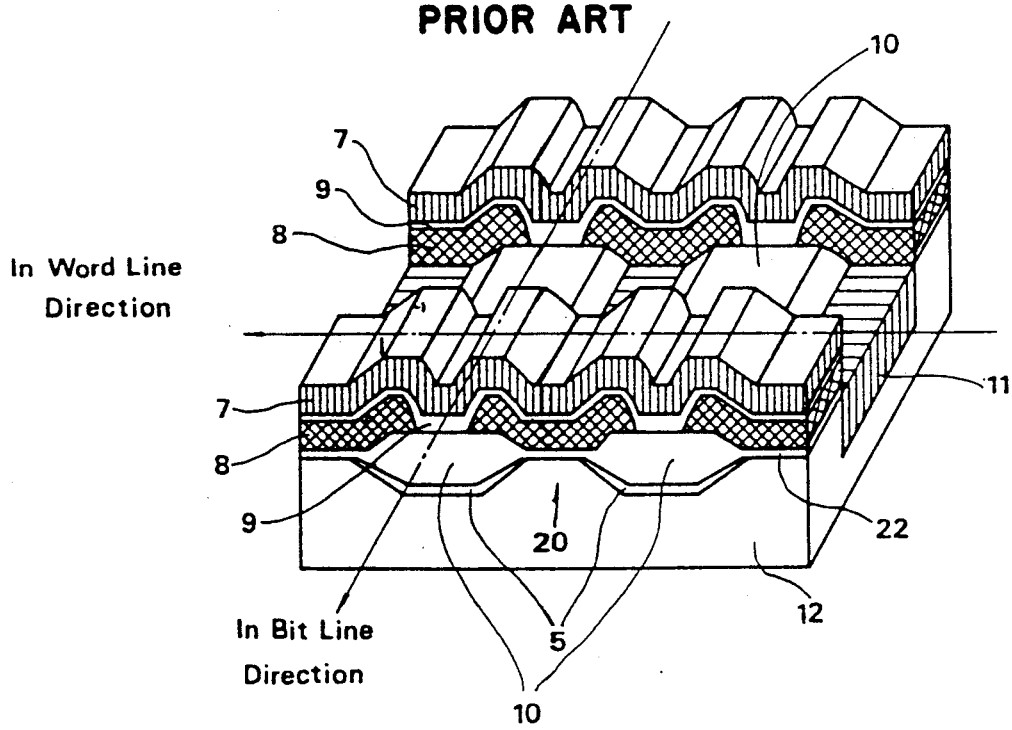
FIG. 2 illustrates a cross-section of the structure of 1 mega bit cell arrangement structure using the prior art EPROM.

FIG. 2 illustrates a cross-section of the prior art EPROM cell arrangement structure in which the prior art 1 mega bit EPROM 20 is employed. Buried diffusion regions 5 are formed at the predetermined location in a substrate 12 and then a buried oxide layer 22 is formed on the substrate 12 between the buried diffusion regions 5, and a first poly layer 8 is then formed on a portion of the buried oxide layer 10 and the first gate oxide layer 22. After this, a second gate oxide film layer 9 is deposited on the entire surface of the structure and a second poly layer 7 is deposited thereon. Also, it comprises the structure in which each EPROM cell 20 is insulated by a field oxide film layer 11 formed in the bit line direction. The buried diffusion region 5 is continuously formed in the substrate 12 in the bit line direction a contact, not shown, is formed with a conductive layer at the buried diffusion region 5 every 16th EPROM cell 20, thereby reducing the resistance of the buried diffusion region.

However, in the structure set forth in the above, since the contact is not formed every two cell as shown in FIG. 1, the area of the cell can be reduced and the integration of the cell can be improved. But, for example, if 512 cells are formed with respect to a selected bit line, the buried diffusion region 5 should be continuously formed thereunder. Therefore, greater parasitic capacitance is produced between the substrate 12 and the buried diffusion region 5 so that the precharging and discharging times become long when a bit line is selected, thereby resulting in the delay of the sensing speed.

Accordingly, the present invention provides an improved integration of cells by reducing the area for integrating the cells and, in order to solve the problems in the prior art as mentioned in above, the present invention utilizes a bit line adjacent to the selected bit line as a ground without forming an additional ground line as in the prior art. Also, the buried diffusion region can be segmentized by utilizing the selecting transistor, the first conductive layer and the second conductive layer.

A preferred embodiment of the present invention will be described in detail in conjunction with FIG. 3 through FIG. 8.

Figure 3:
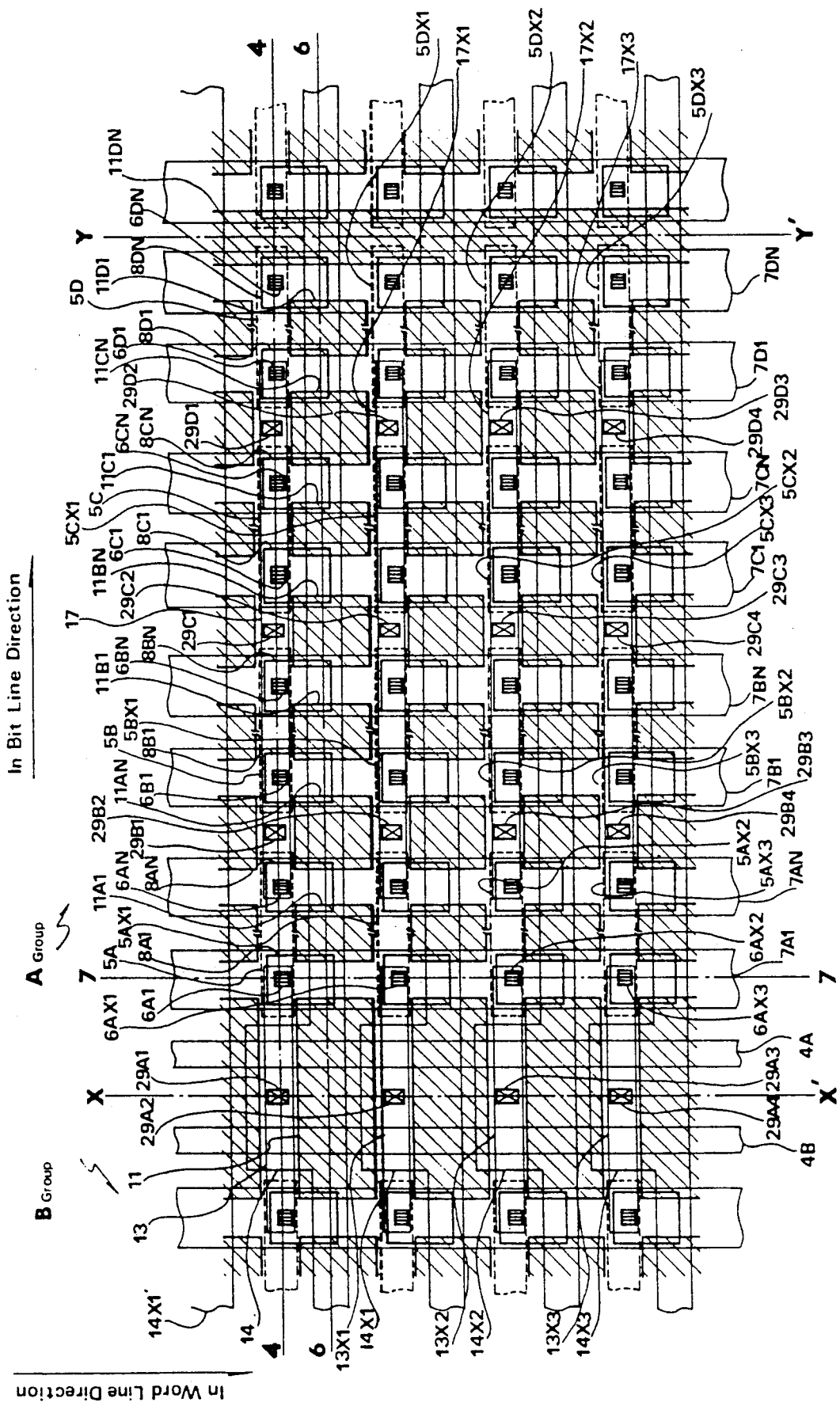
FIG. 3 schematically illustrates a layout of the top view of a EEPROM of the present invention.

FIG. 3 is a top view of a schematic layout of a portion of a semiconductor device integrated with the arrangement of the EEPROM cell utilizing a method of the present invention, and shows the structure having a plurality of contacts 29A1. 29B1. 29C1 and 29D1 and 32 word lines. Furthermore, in the figure, word lines are shown, with a center portion of which is abbreviated. It should be appreciated that the number of the 32 word lines and 8 word line may be varied depending upon the designer's specification.

Referring to FIG. 3 again, the hatched portion is a plurality of field oxide film layers 11A1 ... 11AN, 11B1, 11BN, 11C1 ... 11CN and 11D1 ... for insulation and a field oxide film layer 11DN for segment separation which, are separation regions, and the unhatched portions function as operation regions. In the operation region, a plurality of buried diffusion regions 5A ... 5D, 5AX1 ... 5DX1, 5AX2 ... 5DX2 and 5AX3 ... 5DX3, in the bit line direction and a plurality of tunnel oxide films 6A1... 6AN, 6B1 ... 6BN, 6C1 ... 6CN and 6D1 are arranged in sequence Also, in the word line direction, the first poly layers 8A1... 8AN, 8B1 ... 8BN, 18C1 ... 8CN and 8D1 ... 8DN for floating gate, and second poly layers 7A1 ... 7AN, 7B1 ... 7BN, 7C1 .. . 7CN and 7D1 ... 7DN for gate electrode are arranged Also, a plurality of the contacts 29B1 ... 29D1, 29B2 . .. 29D2, and 29B3 ... 29D3 are formed between the respective buried diffusion regions 5AX1 ... 5DX1, 5AX2 ... 5DX2 and 5AX3 ... 5DX3. In the bit line direction, a first conducting layers 17, 17X1 and 17X2 . .. 17XN for resistance reduction are arranged on buried diffusion regions 5A ... 5D, 5AX1 ... 5DX1, 5AX2 . .. 5DX2 and 5AX3 ... 5DX3. The second poly layers 4A and 4B for the gate electrode which constitutes the selecting transistor which can select a group, i.e. A Group or B group, comprising the buried diffusion regions 5A ... 5B, 5AX1 ... 5DX1, 5AX2 ... 5DX2 and 5AX3 ... 5DX3 are arranged in the word line direction, and a plurality of contacts 29A1 ... 29AN are arranged in the word line direction between the second poly layer 4A and 4B for gate electrode. Then, a plurality of the first conducting layer 13, 13X1 ... 13XN for via contact are formed on the contacts 29A1 ... 29AN. The second conducting layer 14, 14X1, 14X2 ... 14XN for bit line are arranged such that they are overlapped with the first conducting layers 13, 13X1, 13X2 ... 13XN for via contact, but spaced from the first conducting layers 17, 17X1, 17X2 ... 17XN for resistance reduction. Also, the semiconductor device according to the present invention has such structure that it is arranged symmetrically about the central (X axis) of the contacts 29A1 ... 29AN for the selecting transistor and such arrangement structure is positioned repeatedly. The more detailed description of FIG. 3 will provided hereinafter in conjunction with FIG. 4 to FIG. 8.

Figure 4:
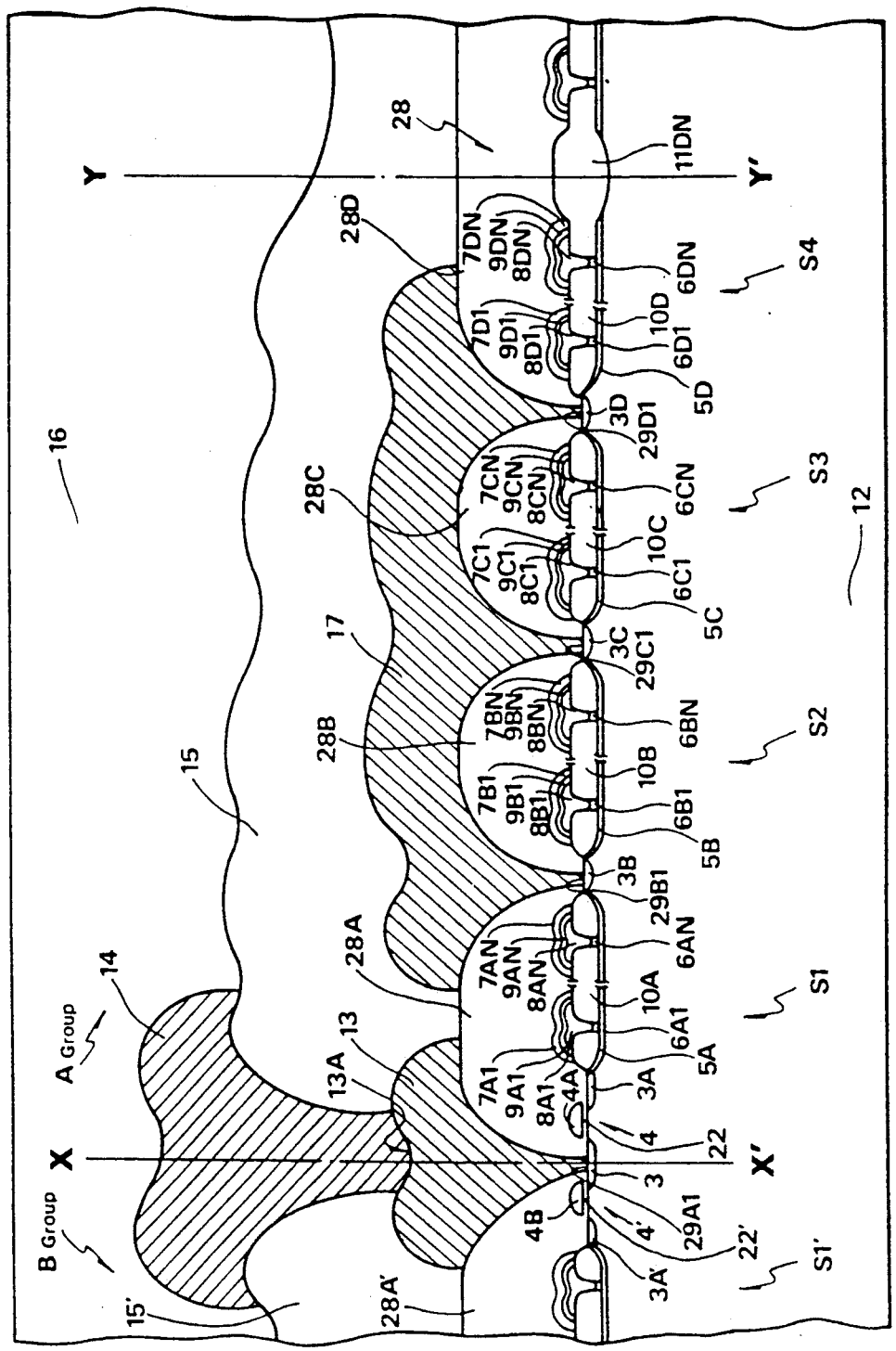
FIG. 4 illustrates a cross-section of FIG. 3 taken along the line 4—4.

FIG. 4 illustrates a cross-section of FIG. 3 taken along the line 4—4. It is assumed that there are two group, i.e. A and B, in which the A group comprising a plurality of segments S1, S2, S3 and S4, shown in the figure, is symmetrical with the B group about X axis. Also, a selecting transistors 4 and 4', which can select the A group or the B group, are formed.

Looking at the structure of selecting transistors 4 and 4', diffusion regions 3, 3A and 3A' are formed on the substrate 12 at the same distance. Then, the second poly layer 4A for gate electrode, and a gate oxide film layer 22 are formed on the substrate (12) between the diffusion region 3 for drain electrode and the diffusion region 3A for source electrode, thereby forming the selecting transistor 4 for selecting the A group. Also, the second poly layer 4B for gate electrode, and a gate oxide film layer 22' are formed on the substrate 12 between diffusion region 3 for drain electrode and the diffusion region 3A' for source electrode, thereby forming the selecting transistor 4' for selecting the B group.

Therefore, each selecting transistor 4 and 4' shares the diffusion region 3 as a drain electrode, respectively. Also, the diffusion region 3 provides a contact 29A1 for the selecting transistors 4 and 4'.

The A group and B group are symmetrically positioned each other about the shared diffusion region 3, i.e. common drain electrode, of the selecting transistors 4 and 4' so that further description of the B group will not be necessary.

In the respective segments S1, S2, S3 and S4, buried diffusion regions 5A, 5B, 5C and 5D are formed on the substrate 12, and buried oxide film layer 10A, 10B, 10C and 10D are formed thereon, respectively. A plurality of tunnel oxide films 6A1 ... 6AN, 6B1 ... 6BN, 6C1 ... 6CN and 6D1 ... 6DN are formed in the respectively buried oxide film layers 10A, 10B, 10C and 10D.

It should be understood that even through only four segmentized buried diffusion regions 5A, 5B, 5C and 5D are illustrated and described herein, however, more buried diffusion regions may be formed.

The first poly layers 8A1 ... 8AN, 8B1 ... 8BN, 8C1 ... 8CN and 8D1 ... 8DN for floating gate, the second gate oxide film layers 9A1 ... 9AN, 9B1 ... 9BN, 9C1 ... 9CN and 9DN and the second poly layers 7A1 ... 7AN, 7B1 ... 7BN, 7C1 ... 7CN and 7C1 ... 7DN for gate electrode are sequentially formed on a plurality of tunnel oxide films 6A1 ... 6AN, 6B1 ... 6BN, 6C1 .. . 6CN and 6D1 ... 6DN, respectively, thereby serving as floating gate and gate electrodes. Diffusion regions 3B, 3C and 3D are formed between the respective buried regions 5A, 5B, 5C and 5D, thereby connecting the buried regions 5A, 5B, 5C and 5D, to one another as well as providing contacts 29B1, 29C1 and 29D1 connected to the first conducting layer 17 for resistance reduction to be formed later. The diffusion regions 3B, 3C and 3D together with their respective contacts 29B1, 29C1 and 29D1, are collectively referred to as the plurality of contact-diffusion regions. Also, one side of the buried diffusion region 5A of the segment S1 is connected to a diffusion region 3A for source electrode of the selecting transistor 4 and one side of the buried region 5D of the segment S4 is isolated in reference with the Y axis from the other group, not shown, which is symmetrically positioned about the Y axis, by a field oxide film 11DN for segment separation.

An insulating layer 28 is deposited on the entire surface of the structure having each segment S1, S2, S3 and S4. By removing a portion of the insulating layer 28 on each contact 29A1, 29B1, 29C1 and 29D1, a plurality of first insulating layers 28A, 28B, 28C and 28D are formed. Next, conducting layer is deposited on the contacts 29A1, 29B1, 29C1 and 29D1 and the first insulating layer 28A, 28B, 28C and 28D. By removing a portion of the conducting layer on the first insulating layers 28A and 28D with a known mask process, the first conducting layer 13 for via contact, which is formed on the contact 29A1 separately, and the first conducting layer 17 for resistance reduction, which is formed continuously on the contacts 29B1, 29C1 and 29D1, are formed respectively. Then, the second insulating layer 15 is deposited over the entire surface. A portion of the second insulating layer 15 on the first conducting layer 13 for via contact is removed, thereby obtaining a contact 13A for bit line on the first conducting layer 13. The second conducting layer 14 for bit line is formed on the first conducting layer 13 where the contact 13A for bit line is exposed, and a protective layer 16 is deposited on the second conductive layer 14 and the second insulating layer 15.

In the structure of semiconductor device according to the present invention, for example, the four buried diffusion regions 5A, 5B, 5C and 5D connected to a selecting transistor 4 are provided with four segments S1, S2, S3 and S4 and one side of the buried diffusion region 5A is connected to the first conducting layer 13 for via contact through the selecting transistor 4, resulting in electrically connecting it to the second conducting layer 14 for bit line, and the other side of the buried diffusion region 5A and the remaining buried diffusion regions 5B, 5C and 5D are connected to each other by a plurality of diffusion regions 3B, 3C and 3D formed therebetween, respectively. Also, the first conducting layer 17 for resistance reduction is formed such that it is connected to the diffusion regions 3B, 3C and 3D through the contact 29B1, 29C1 and 29D1 formed thereon. Accordingly, the second conducting layer 14 for bit line is not connected directly to the A group or B group but selectively connected through the selecting transistors 4 and 4', thereby greatly reducing parasitic capacitance occurred between the substrate and buried diffusion region.

Figure 5:
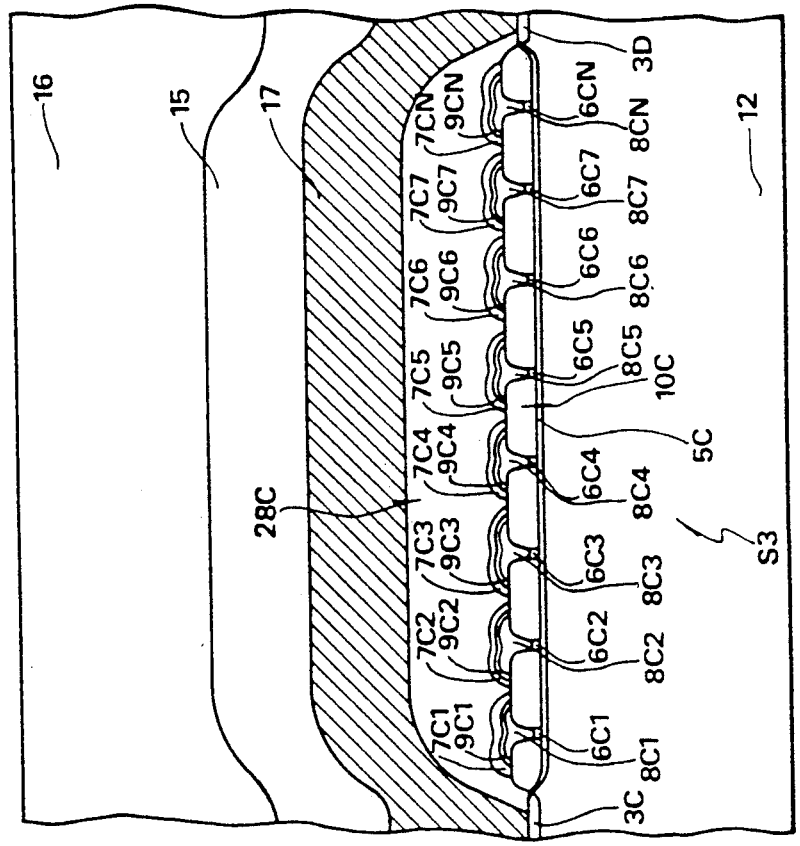
FIG. 5 illustrates an enlarged cross-section of "S3" portion shown in FIG. 4.

FIG. 5 shows an enlarged illustration of the segment S3 of FIG. 4. A buried diffusion region 5C can be formed taking the resistance into account. In the preferred embodiment of the present invention, eight first poly layers 8C1 . . . 8CN for floating gate, and the second poly layers 7C1 . . . 7CN for gate electrode are formed, resulting in the formation of eight cells. This may be varied depend upon the designer's specification. Also, the first insulating layer 28C, the first conducting layer 17, the second insulating layer 15 and the protective layer 16 are sequentially formed on the second poly layer 7C1 . . . 7CN.

Figure 6:
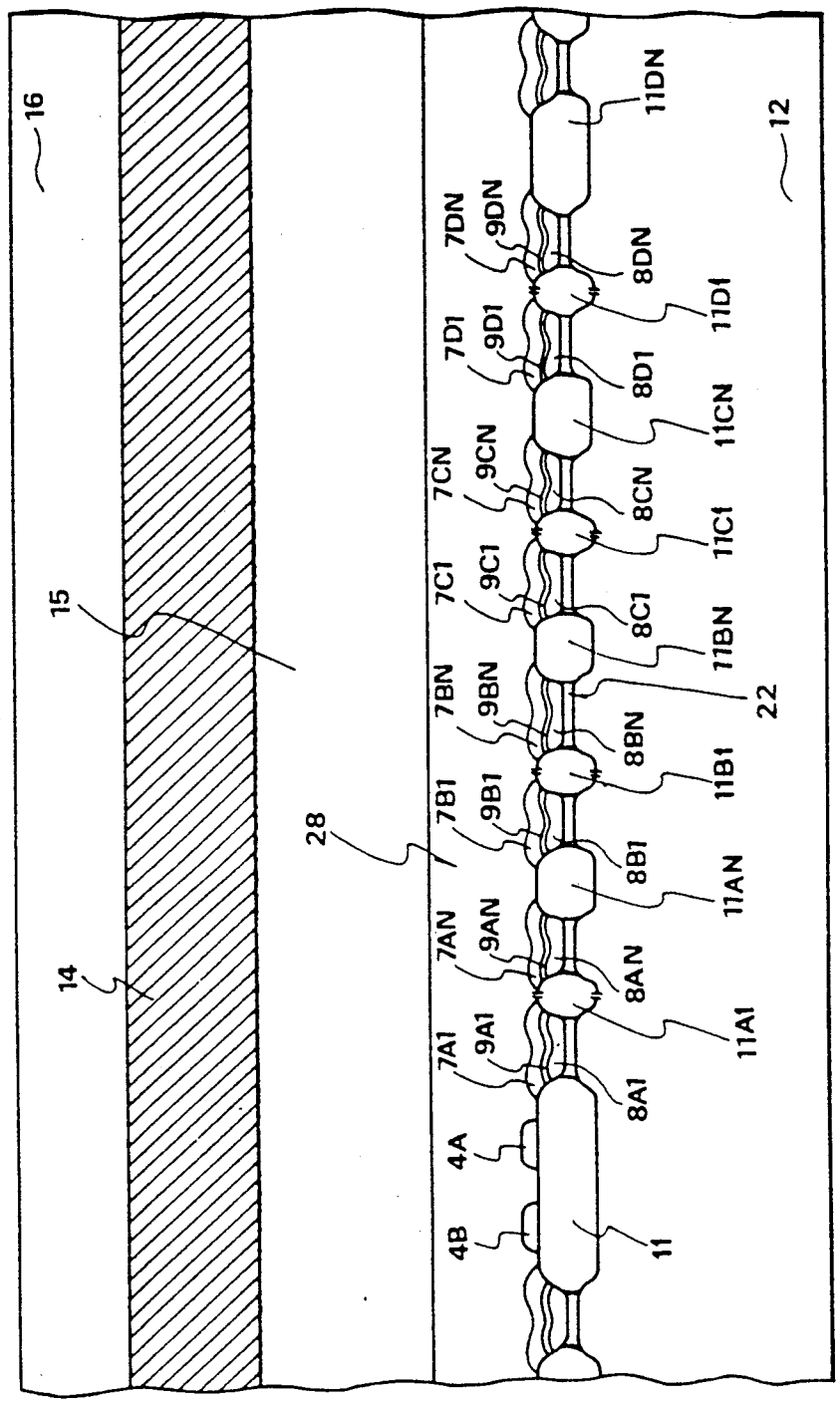
FIG. 6 illustrates a cross-section of FIG. 3 taken along the line 6—6.

FIG. 6 illustrates a cross-section of FIG. 3 taken along the line 6—6, which clearly shows a cell arrangement according to the present invention. In this arrangement, the operating region and the separating region are usually formed on the substrate 12 as described in connection with FIG. 3, in which the field oxide film layers 11, 11A1 . . . 11AN, 11B1 . . . 11BN, 11C1 . . . 11CN and 11D1 . . . for insulation, and the oxide film layer 11DN for segment separation are formed as the isolating region, and the gate oxide film layer 22, the first poly layers 8A1 . . . 8AN, 8B1 . . . 8BN, 8C1 . . . 8CN and 8D1 . . . 8DN for floating gate, the second gate oxide film layer 9A1 . . . 9AN, 9B1 . . . 9BN, 9C1 . . . 9CN and 9D1 . . . 9DN and the second poly layer 7A1 . . . 7AN, 7B1 . . . 7BN, 7C1 . . . 7CN and 7D1 . . . 7DN for gate electrodes are formed as the operating region. The second poly layers 4A and 4B for gate electrode are formed at the predetermined position on the field oxide film layer 11 for insulation and the first insulating layer 28, the second insulating layer 15, the second conducting layer 14 and the protective layer 16 are sequentially formed on the entire surface.

Figure 7:
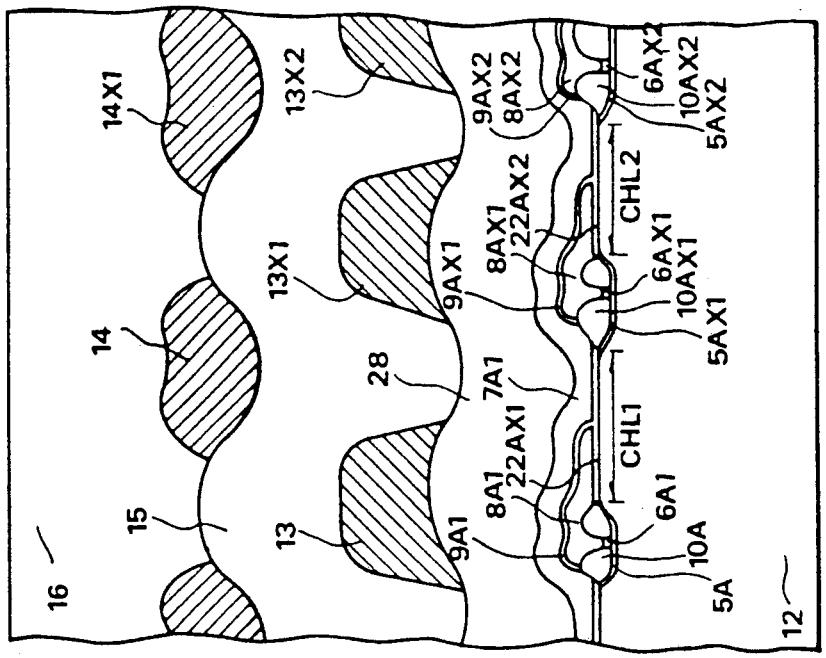
FIG. 7 illustrates a cross-section of FIG. 3 taken along the line 7—7.

FIG. 7 illustrates a cross-section of FIG. 3 taken along the line 7—7. The buried oxide film layers 10A, 10AX1 and 10AX2 are formed on the buried diffusion regions 5A, 5AX1 and 5AX2 formed in the substrate 12 with these being spaced one another. After a portion of the buried oxide film layers 10A, 10AX1 and 10AX2 is removed, the tunnel oxide film 6A1, 6AX1 and 6AX2 are formed. Also, the first gate oxide film layers 22AX1 and 22AX2 are formed on the substrate 12 between the respective buried diffusion regions 5A, 5AX1 and 5AX2. Then, on each portion from a portion of each buried oxide film layer 10A, 10AX1 and 10AX2 rightward to a portion of each the first gate oxide film layer 22AX1 and 22AX2, the respective first poly layers 8A1 and 8AX2 are formed, and the second gate oxide film layers 9A1, 9AX1 and 9AX2 are formed on the first poly layers 8A1, 8AX1 and 8AX2, respectively. The second poly layer 7A1 for gate electrode is formed on the entire surface. After this, the first insulating layer 28, the first conducting layers 13 and 13X1 and 13X2, the second insulating layer 15, the second conducting layer 14 and 14X1, and a protective layer 16 are sequentially formed on the second poly layer 7A1 for gate electrode.

Accordingly, the respective buried diffusion regions 5A and 5AX1 function as a drain electrode or a source electrode, respectively. For example, if a voltage is applied to the buried diffusion region 5A, the adjacent buried diffusion region 5AX1 is further to be ground and a voltage is also applied to the second poly layer 7A1, a channel CHL1 is then formed between the buried diffusion regions 5A and 5AX1. In the same manner, another channel CHL2 is formed between the buried diffusion regions 5AX1 and 5AX2. At this time, in the channel CHL1, the buried diffusion region 5A functions as a drain electrode and the buried diffusion region 5AX1 functions as a source electrode.

Figure 8:
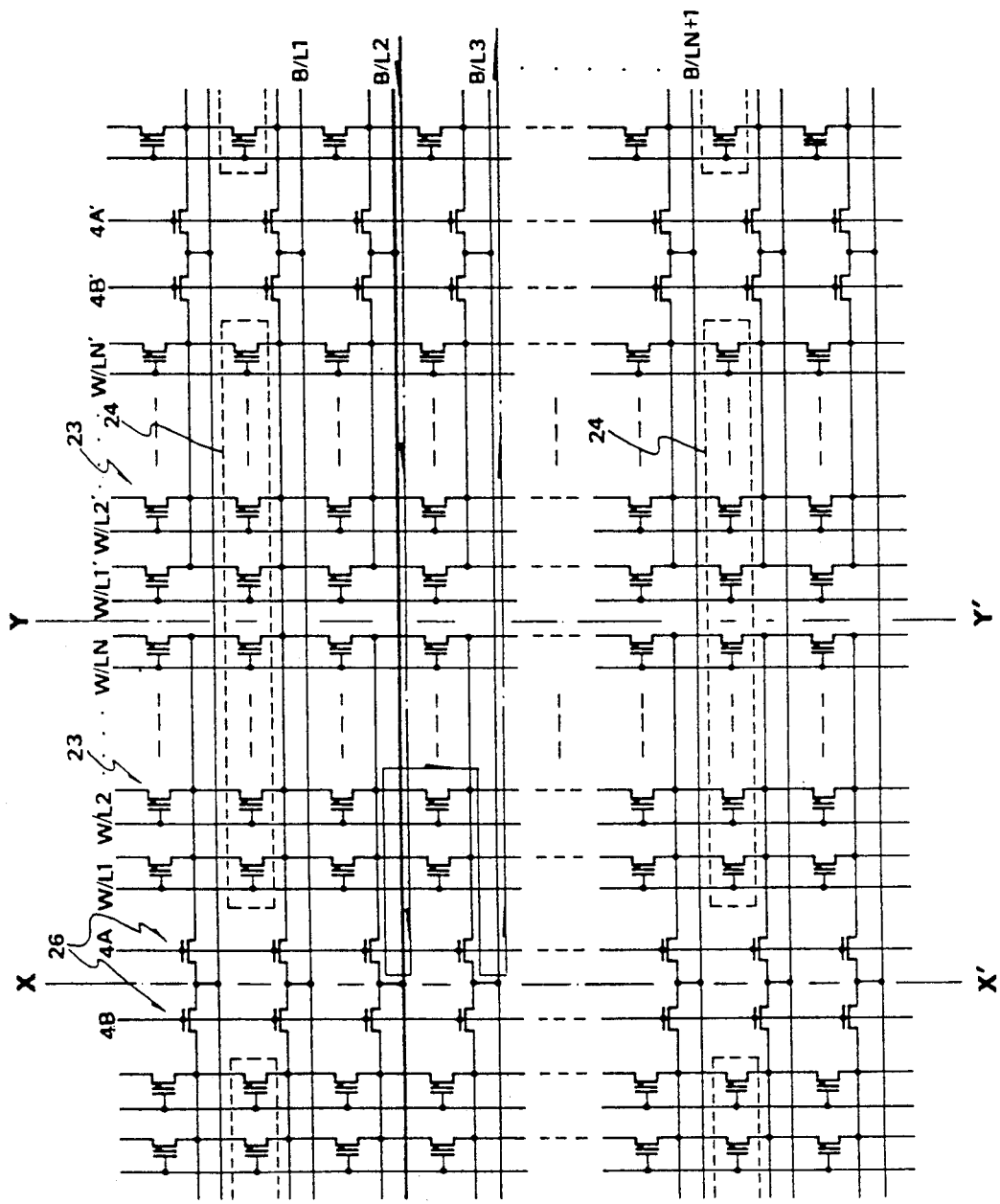
FIG. 8 illustrates an equivalent circuit for the EEPROM cell arrangement according to the present invention.

FIG. 8 illustrates an equivalent circuit of the EEPROM cell arrangement structure according to the present invention. For example, a plurality of word lines W/L1 . . . W/LN and a plurality of bit lines B/L1 . . . B/LN are arranged in longitudinal and transversal directions, respectively, and more particularly, these lines are arranged symmetrically about Y axis as shown in FIG. 8 and such arrangement structure can also be positioned repeatedly. Whenever a plurality of bit lines B/L1 . . . B/LN are formed, one column of the erased cells 24 is formed. The reason why the erased cell is formed is as follows: In the case that all the cells 23 positioned in the direction of the word lines W/L1 . . . W/LN are programmed, when a predetermined bit line is selected, the channel for all the cells in the direction of the word line are formed. Therefore, the unselected bit line which is not precharged is electrically coupled to the bit line which is grounded so that the current consumption ia increased. Accordingly, in order to prevent the over current, after a plurality of bit lines B/L1 . . . B/LN are formed, a column of the erased cell 24 is formed every bit line B/LN+1.

In the case that the predetermined bit line and word line are selected, the reading operation will be described hereinafter in conjunction with FIG. 8 as shown.

For example, when the bit line B/L2 is selected and 2.5 V is then applied thereto, and the word line W/L2 is selected after the bit line B/L3 is to be ground and 5 V is then applied, the selecting transistor connected to the second poly layer 4A for gate electrode turns on so that the current flows from the bit line B/L2 in the direction of the arrow as shown in FIG. 8, to the bit line B/L3 through the cell connected to word line W/L2 and located between the bit lines B/L2 and B/L3. Accordingly, writing or erasing of the cell can be determined depending upon the conduction or non-conduction of the cell connected to the word line W/L2 and located between the bit lines B/L2 and B/L3.

The constitutional operation of EEPROM according to the present invention will be described hereinafter in conjunction with the description as given above.

In the EEPROM according to the present invention, the method for assigning address for 8 bit data, for example, when word line address comprises n+5 bits, the gate electrodes ($2^n$ = the total number of the gate electrode of selecting transistors 26) are selected by significant n bits ($2^n$ = total word lines/32) and the word lines of bit line segments where the selected gate electrodes are located are determined by 5 less significant bits.

For example, if there are 1024 word lines, $2^n$ = 1024/32, therefore, n=5. The address of word line become 10 bits, and 5 significant bits of 10 bits determines the selection of gate electrodes of selecting transistor and 5 less significant bite thereof are utilized to select 32 word lines on the bit line.

Assigning the bit line address, the way of selection, when the assigned address selects, for example, 8 bit lines, selects only one bit line in a block comprising on erased cell and 8 bit lines. Such way does not require any additional ground and when reading, a voltage is applied to the bit line at side of the drain of selected cell and the bit line at the source of selected cell is grounded. Then, the conduction or nonconduction of cell can be sensed.

The reason for the positioning of the column of the erased cells 24 will be described in detail hereinafter. If 5 V is applied to the word line on which all the cells has been written, all the sources and drains of the cells positioned on the word line are conductive. Accordingly, since the unselected bit line which is not precharged is electrically coupled to the bit line which is grounded, the current consumption is increased so that power consumption becomes large. Therefore, an erased cell is positioned every 8 bit lines, thereby keeping the current flowing in the ground line direction at predetermined level.

The operation of the EEPROM cell employed in the present invention will be described. When the potential difference between the buried diffusion region and the first poly layer (the floating poly) is applied, by a voltage condition applied to the buried diffusion region and the second poly layer for gate electrode, enough to produce an electric field for making the tunneling of electron across the tunnel oxide film, the electrons are accumulated in the first poly layer which is a floating poly, or moves to the buried diffusion region in accordance with the Fowler-Nordheim tunneling mechanism. Therefore, the cell becomes erased state or written state.

In the writing operation of cell, for example −3 or −4 V is applied to the selected word line in the cell arrangement and 12 V is applied to the selected bit line. As result of potential difference between the second poly layer and the buried diffusion region, the electrons in the first poly layer move to the buried diffusion region through the tunnel oxide film. At this time, the threshold voltage (VT) of the cell becomes 0.6 to 1.0 V and 14 V is applied to the gate electrode of the selected transistor.

In the erasing operation, 16 to 17 V is applied to the selected word line and 0 V i.e. no voltage is applied to the selected bit line. Accordingly, a potential difference occurs between the second poly layer connected to the word line and the buried diffusion region connected to the bit line so that the electrons in the buried diffusion region are accumulated in the first poly layer, that is, the floating poly through the tunnel oxide film. At this time, the threshold voltage (VT) is 4 to 5 V and 5 V is applied to the gate electrode of the selecting transistor.

In the meantime, the bit line, which is not selected during the writing operation, becomes the floating state, and 7 V is applied to the unselected word line. Also, 0 V is applied to the unselected second poly layer for gate electrode of the selecting transistor.

In the reading operation, 2.5 V, which is an intermediate voltage between the threshold voltages of the writing operation and the reading operation of the cell, is applied to the selected word line and 2.5 V is applied to the bit line for drain electrode of the selected cell, and 5 V is applied to the second poly layer for gate electrode of the selecting transistor of the segment where the selected word line is positioned. Then, the selected bit line and the adjacent bit line for source electrode are grounded, thereby detecting the flow of current.

At this time, if it was erased, the channel is not formed so that the current cannot flow.

During the reading operation, the unselected word line and the second poly layer for gate electrode of the selecting transistor are grounded, and 2.5 V is applied to the unselected bit line.

As described above, the present invention can reduce the area of EEPROM arrangement over the prior art EEPROM arrangement structure.

For example, the area of the prior art EEPROM cell has approximately 70 um$^2$, but the area of EEPROM cell utilizing the EEPROM cell arrangement structure of the present invention has only 40 um$^2$. Therefore, remarkable reduction on the area is accomplished.

Also, according to the present invention, the buried diffusion region are segmentized and hence, the voltage is applied only to the buried diffusion region selected by the selecting transistor, therefore, a parasitic capacitance is not produced between the buried diffusion region and the substrate. As result of this, the delay of sensing time is greatly improved.

The foregoing description of the preferred embodiment has been presented for the purpose of illustration and description. It is not intended to limit the scope of this invention. Many modifications and variation are possible in the light of above teaching. It is intended that the scope of the invention be defined by the claims.

What is claimed is:

1. A semiconductor device having a plurality of EEPROM cells, wherein said EEPROM cells are arranged in a bit line direction and in a word line direction, comprising:

a plurality of segmentized buried diffusion regions formed on a semiconductor substrate, with each of said segmentized buried diffusion regions being sequentially spaced in a bit line direction and also sequentially spaced in a word line direction, and said plurality of segmentized buried diffusion regions spaced in said bit line direction including a first segmentized buried diffusion region and a last segmentized buried diffusion region;

a plurality of buried oxide film layers formed on each of said segmentized buried diffusion regions;

a plurality of tunnel oxide film layers formed on each of said buried oxide film layers;

a plurality of first gate oxide film layers with each of said first gate oxide film layers being formed on said substrate and extending between each of said respective segmentized buried diffusion regions in said word line direction;

a plurality of first poly layers for a floating gate with each of said first poly layers for said floating gate being formed on a portion of each of said first gate oxide film layers and on each of said tunnel oxide film layers in said word line direction;

a plurality of second gate oxide film layers with each of said second gate oxide film layers being formed on each of said first poly layers for said floating gate;

a plurality of second poly layers for a gate electrode with each of said second poly layers for said gate electrode extending in said word line direction and being formed on each of said second gate oxide film layers and on a portion of each of said first gate oxide film layers, thereby forming a plurality of EEPROM cells arranged in said word line direction and said plurality of EEPROM cells including an erased cell at a predetermined number of said EEPROM cells arranged in said word line direction;

a plurality of contact-diffusion regions with each of said contact-diffusion regions being formed on the substrate between each of said segmentized buried diffusion regions, respectively, for connecting said plurality of segmentized buried diffusion regions in said bit line direction and with each of said contact-diffusion regions further including a contact for connection therewith;

a plurality of selecting transistors with each of said selecting transistors being spaced in said word line direction, and being connected to said first segmentized buried diffusion region, and each of said selecting transistors comprising a diffusion region for a source electrode, a second poly layer formed on a gate oxide film layer which is formed on said substrate, and a diffusion region for a drain electrode for sharing which is shared by another selecting transistor of said plurality of selecting transistors, said diffusion region for said drain electrode for sharing further including a contact, thereby connecting said selecting transistor of said plurality of selecting transistors by said diffusion region for said source electrode to said first segmentized buried diffusion region of each of said segmentized buried diffusion regions;

a plurality of field oxide film layers for insulation formed on said substrate between each of said second poly layers for said gate electrode in said bit line direction and between each of said segmentized buried diffusion regions in said word line direction;

a field oxide film layer for segment separation extending in said word line direction and being formed at each of said last segmentized buried diffusion regions of said plurality of segmentized buried diffusion regions formed in said bit line direction;

a first insulating layer covering a surface comprising said plurality of buried oxide film layers, said plurality of second poly layers for said gate electrode, said plurality of selecting transistors, and said plurality of field oxide film layers for insulation and said field oxide film layer for segment separation, save for each of said contact-diffusion regions and each of said contacts of said diffusion regions for said drain electrode for sharing;

a plurality of first conducting layers for via contact connected with each of said contacts of each of said diffusion regions for drain for sharing, and each of said first conducting layers for via contact further including a bit line contact;

a plurality of first conducting layers for resistance reduction formed on said first insulating layer for connecting each of said contacts of said plurality of said contact-diffusion regions;

a second insulating layer covering a surface comprising said first insulating layer and said plurality of first conducting layers for resistance reduction save for each of said bit line contacts of said first conducting layer for via contact of said plurality of first conducting layers for via contact;

a plurality of second conducting layers for bit line for connecting each of said bit line contacts of said first conducting layer for via conduct of said plurality of first conducting layers for via contact to enable, in use, each of said selecting transistors to connect each of said segmentized buried diffusion regions to a bit line through each of said first conducting layers for via contact and each of said second conducting layers for bit line;

a protective layer formed on said second conducting layer for bit line and said second insulating layer thereby forming a group A structure;

a group B structure consisting of said group A structure wherein said diffusion region for said drain electrode for sharing is shared by said group A structure and said group B structure, thereby providing a semiconductor device having said plurality of EEPROM cells arranged to selectively connect, in use, said segmentized buried diffusion regions to said bit line selected by said selecting transistors, so that a parasitic capacitance produced between said substrate and said segmentized buried diffusion regions is reduced.

2. The semiconductor device of claim 1 wherein said group A structure and said Group B structure formed on each of said plurality of segmentized buried diffusion regions and connected to each of said selecting transistors, respectively, are arranged symmetrically about an X axis which extends through said diffusion region for said drain electrode for sharing, thereby providing a symmetric structure which is repeated in said bit line direction.

3. The semiconductor device of claim 1 wherein said first conducting layers for via contact, said first conducting layers for resistance reduction, and said second conducting layers for bit line are metal.

* * * * *